United States Patent [19]

Young

[11] Patent Number: 5,658,805
[45] Date of Patent: Aug. 19, 1997

[54] METHOD OF FABRICATING THIN-FILM TRANSISTORS

[75] Inventor: Nigel D. Young, Redhill, England

[73] Assignee: U.S. Philips Corporation, New York, N.Y.

[21] Appl. No.: 471,803

[22] Filed: Jun. 6, 1995

Related U.S. Application Data

[62] Division of Ser. No. 369,042, Jan. 5, 1995, abandoned, which is a continuation of Ser. No. 168,098, Dec. 15, 1993, abandoned, which is a continuation of Ser. No. 902,645, Jun. 23, 1992, abandoned.

[30] Foreign Application Priority Data

Jun. 28, 1991 [GB] United Kingdom ............... 9113979

[51] Int. Cl.⁶ .................. H01L 21/336; H01L 29/786
[52] U.S. Cl. ............................. 438/151; 438/163
[58] Field of Search ..................... 257/9, 219, 57, 257/59, 66; 437/21, 40 TFT, 44, 101

[56] References Cited

U.S. PATENT DOCUMENTS 5,488,005  1/1996  Han et al. ..................... 437/44

FOREIGN PATENT DOCUMENTS 60-047464  3/1985  Japan.
01-285 73  5/1989  Japan.
6-13405    1/1994  Japan ..................... 437/40 TFT

OTHER PUBLICATIONS

Kamins et al., "Monolithic Integrated Circuit Fabricated in Laser-Annealed Polysilicon", IEEE Transactions on Electron Devices, vol. ED27, No. 1, Jan., 1980, pp. 290–293.

*Primary Examiner*—Mary Wilczewski
*Attorney, Agent, or Firm*—Steven R. Biren

[57] ABSTRACT

The off-state leakage current, threshold voltage and on-state current of a thin-film transistor (TFT) can be degraded by operation at high drain bias voltages, e.g. above 15 volts. Such degradation is significantly reduced by forming the drain (6) as a highly-doped semiconductor electrode layer (56) on part of an intermediate lower-doped layer (55) on the semiconductor film (2) forming the TFT channel. The drain electrode layer (56) is laterally separated from the transistor channel. An area (A) of the intermediate layer (55) not overlapped by the electrode layer (56) nor modulated by the gate (4) extends from the drain electrode layer (56) towards the gate (4) so as to provide along the intermediate layer (55) a low-doped field-relief region in at least part of the area of lateral separation. The TFTs may be, for example, of the coplanar type or even of the inverted staggered type.

6 Claims, 2 Drawing Sheets

METHOD OF FABRICATING THIN-FILM TRANSISTORS

This is a division of application Ser. No. 08/369,042, filed Jan. 5, 1995, now abandoned which is a continuation of 08/168,098, filed on Dec. 15, 1993, now abandoned which is a continuation of 07/902,645, filed on Jun. 23, 1992 now abandoned.

BACKGROUND OF THE INVENTION

This invention relates to thin-film transistors (TFTs) comprising a semiconductor film which provides a transistor channel and having a drain which comprises semiconductor layers of different doping concentrations, particularly but not exclusively TFTs of the so-called "coplanar" type in which the source and drain are formed from layers deposited on the same face of the semiconductor film as the gate structure. TFTs in accordance with the present invention are designed to reduce degradation of their characteristics (both on-state current and off-state leakage current) due to operation at high drain bias. Such transistors are of interest at present for large-area electronic circuitry on glass, for example in the driving circuitry of a large-area liquid-crystal display (LCD) or a sensor array or memory array or a printer. The invention also relates to methods for the manufacture of TFTs.

Published Japanese patent application Kokai JP-A-01-128573 of 1989 discloses a thin-film transistor comprising a semiconductor film which provides a transistor channel coupled to a gate of the transistor. The transistor has laterally separate source and drain with the transistor channel located therebetween. At least the drain which is disposed at a face of the semiconductor film comprises an intermediate semiconductor layer which lies between the semiconductor film and a semiconductor electrode layer; this intermediate layer has a lower conductivity-determining doping concentration than the electrode layer and serves to reduce the electric field intensity in the region between the gate and the drain electrode layer.

In the off state of this known TFT (i.e. when a negative or zero gate voltage is applied in an n channel transistor, or when a positive or zero gate voltage is applied in a p channel transistor), the electric field formed by the applied gate and drain voltages is distributed in the low-doped intermediate layer so reducing the field intensity at the drain junction. This reduction in field is believed to reduce the number of charge-carriers generated at trap levels in the semiconductor film in the vicinity of the drain, for example trap levels at crystal-grain boundaries of a polycrystalline semiconductor film. Hence the off-state leakage current across the drain junction is reduced by the inclusion of this intermediate layer.

However, the present applicants have found that the off-state leakage current can increase during the life of a TFT due to operation of the TFT at high drain bias, and the applicants believe that this degradation in off-state leakage current is due to the formation of donor levels near the middle of the energy bandgap of the semiconductor film by hot carriers generated in the space charge region at the drain junction in the on-state of the TFT. Thus, the off-state characteristic is degraded by high drain bias in the on-state operation of the TFT. The on-state current is also degraded (i.e. reduced) by repeated operation at high drain bias. A shift in the threshold voltage of the TFT may also occur.

SUMMARY OF THE INVENTION

The present invention is based on a recognition that this degradation in off-state leakage current, on-state current and threshold voltage can be reduced by adopting a modified drain layer structure which can be formed comparatively easily and cheaply (e.g. compatible with existing deposition and etching processes used for manufacturing TFTs). In this modified structure in accordance with the invention a low-doped intermediate layer (lying between the drain electrode layer and the semiconductor film) also extends laterally towards the channel over an area not overlapped by the drain electrode layer and not modulated by the gate so that even in the on-state the low-doped intermediate layer provides field relief along this area of the layer. In this respect, it should be noted that the low-doped intermediate layer in the TFT drain of JP-A-01-128573 is wholly overlapped by the drain electrode layer and also (at the side) by the gate, and so the gate modulates the drain junction and forms a charge inversion region in the intermediate layer in the on-state of the TFT as it also does in the channel. The benefit of the low doping of the intermediate layer in this TFT structure of JP-A-01-128573 is thus lost in its on-state, and the advantages of the present invention are not achieved.

In accordance with one aspect of the present invention there is provided a thin-film transistor comprising a semiconductor film which provides a transistor channel coupled to a gate of the transistor; the transistor has a drain which is disposed at a face of the semiconductor film and which comprises a semiconductor electrode layer and an intermediate semiconductor layer, which intermediate layer lies between the semiconductor film and the semiconductor drain electrode layer, has a lower conductivity-determining doping concentration than the electrode layer and serves to reduce the electric field intensity in the region between the gate and the drain electrode layer. Such a transistor is, according to the invention, characterized in that, viewed perpendicular to the face of the film, the drain electrode layer is separated laterally from the transistor channel, and there is present an area of the intermediate layer which is not overlapped by the drain electrode layer and not modulated by the gate and which extends from the drain electrode layer towards the gate so as to provide along the intermediate layer a low-doped field-relief region in the area of lateral separation.

An appreciable proportion of the applied drain bias is dropped along part of the length of the low-doped intermediate layer, and so the field intensity at both the drain side and the channel side is reduced so reducing the generation of hot carriers. In this way, hot-carrier degradation of both the on-state current and off-state leakage current can be reduced. This area is not modulated by the gate voltage, but the charge-carriers can drift through this area between the channel and the drain electrode layer in the on-state of the TFT. Furthermore, this advantageous drain layer structure can be formed comparatively easily and cheaply as a modification of known process steps in the manufacture of TFTs.

Thus, in accordance with another aspect of the present invention there is provided a method of manufacturing a thin-film transistor comprising a semiconductor film which provides a transistor channel coupled to a gate of the transistor, the transistor having a drain disposed at a face of the semiconductor film, the drain being formed by depositing a semiconductor electrode layer on an intermediate semiconductor layer on the face of the semiconductor film, wherein the intermediate layer is doped with a lower conductivity-determining doping concentration than the electrode layer and serves to reduce the electric field intensity in the region between the gate and the drain electrode layer. According to the present invention such a method is characterized by the steps of (a) removing from the intermediate layer a part of the drain electrode layer so as to separate the drain electrode layer laterally from the transistor channel, and to form an area of the intermediate layer which is not overlapped by the drain electrode layer, and (b) providing the gate so as not to overlap and modulate at least a part of the said area of the intermediate layer, which part thereby provides along the intermediate layer a low-doped field-relief region in the area of lateral separation.

Step (a) may be carried out either before or after step (b). When the gate is provided before step (a), a photolithographic step may be carried out using the gate as a photomask to define a window in a photoresist layer on the electrode layer. By etching the semiconductor layer or layers through this window, the layers may be divided into source and drain separated from each other at the gate area, and/or the drain electrode layer may be etched away from an area of the intermediate layer so as to form the drain field-relief region.

In order to obtain a low drain series resistance, the area of the intermediate layer providing the low-doped field-relief region may extend along substantially the whole area of the lateral separation, from the transistor channel to the drain electrode layer. Such a feature can be obtained easily in a TFT of the so-called "coplanar" type, in which the gate is present on an insulating layer at the same face of the semiconductor film as the source and drain. Thus, both the insulating layer and gate may overlap the intermediate layer adjacent to the area providing the low-doped field-relief region.

However, the present invention may be adopted not only in TFTs of the "coplanar" type but also in other types, for example TFTs of the so-called "staggered" type in which the source and drain are formed at one face of the semiconductor film and the gate structure is formed at the opposite face. Thus, a TFT having a drain structure in accordance with the present invention may be of the so-called "inverted staggered type" in which an insulated gate is buried between the semiconductor film and a substrate and in which the source and drain are formed from semiconductor layers deposited on the upper face of the semiconductor film remote from the substrate. TFT structures are also possible in which the source and drain are disposed on different faces of the semiconductor film, or in which the source is formed in the film and the drain is deposited on the film.

Although it is advantageous in reducing drain series resistance for the low-doped region to extend continuously between the channel and drain electrode layer, other layout arrangements can also be adopted in accordance with the invention. Thus for example, viewed perpendicular to the face of the film, a gap may be present between the gate and the area of the intermediate layer providing the low-doped field-relief region. The formation of such a gap may be advantageous, for example in reducing gate-to-drain capacitance and may result in a higher-yield manufacturing process (for example in reducing risks of a gate-to-drain short-circuit in a coplanar type TFT).

The drain electrode layer and intermediate layer may be formed by depositing two distinct layers under two different dopant-supply conditions so that one layer has a lower conductivity-determining doping concentration than the other. In this case a step in the doping level occurs at the interface between the two layers, and this step can facilitate selective removal of the electrode layer from the intermediate layer in a more reproduceable manner during manufacture. However, the drain electrode layer and intermediate layer may be deposited in a single deposition step during which the doping concentration is varied gradually from a low level for the intermediate layer to a high level for the electrode layer, and this can result in a lower drain series resistance due to the doping gradient remaining in the intermediate layer part. Thus, the electrode layer and intermediate layer may be parts of a single deposited layer. It is also possible to deposit the semiconductor material for both layer parts with a low doping level (or even no doping concentration) and then to dope the material subsequently to a desired doping profile by dopant ion implantation or diffusion into at least the electrode layer part.

BRIEF DESCRIPTION OF THE DRAWINGS

These and other features in accordance with the invention are illustrated specifically in embodiments of the invention now to be described, by way of example, with reference to the accompanying diagrammatic drawings. In these drawings.

Figure 1:
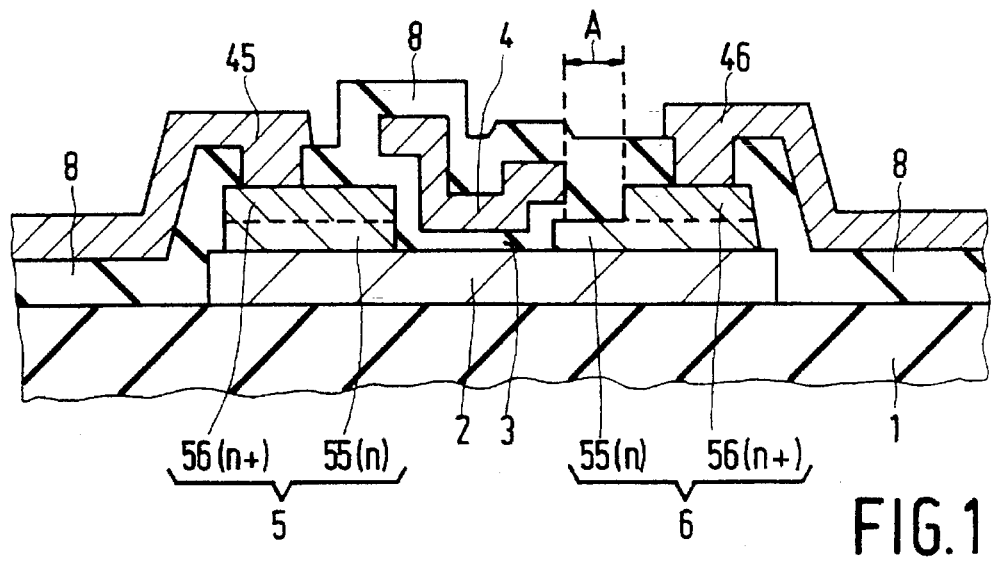
FIG. 1 is cross-sectional view of one TFT manufactured in accordance with the present invention.

It should be noted that all the drawings are diagrammatic and not drawn to scale. Relative dimensions and proportions of parts of the Figures have been shown exaggerated or reduced in size for the sake of clarity and convenience in the drawings. The same reference signs are generally used to refer to corresponding or similar features in the different embodiments.

DESCRIPTION OF THE PREFERRED EMBODIMENTS

The thin-film transistor of FIG. 1 comprises a semiconductor film 2 which provides a transistor channel coupled to a gate 4 of the transistor. The transistor channel is located between laterally separate source and drain 5 and 6 which are disposed at a face of the semiconductor film 2. The drain 6 (and also the source 5 in FIG. 1) comprises an intermediate semiconductor layer 55 which lies between the semiconductor film 2 and a semiconductor electrode layer 56. This intermediate layer 55 has a lower conductivity-determining doping concentration than the electrode layer 56.

In accordance with the present invention the drain 6 has a structure in which, viewed perpendicular to the face of the film 2, the drain electrode layer 56 is separated laterally from the transistor channel, and an area A of the intermediate layer 55 is not overlapped by the drain electrode layer 56 and not modulated by the gate 4 and extends from the drain electrode layer 56 towards the gate 4. This area A of the intermediate layer 55 serves to reduce the electric field intensity in the region between the gate 4 and the electrode layer 56 of the drain 6. The area A provides a low-doped field-relief region in the area of lateral separation between the transistor channel and the electrode layer 56 of the drain 6. This drain structure reduces degradation of the TFT characteristics which would otherwise occur due to hot-carrier effects as described below. Such hot carrier degradation effects are found to become particularly important for TFTs having high values of field-effect mobility, for example such as result from the use of large-grain polycrystalline silicon for the film 2.

The TFT of FIG. 1 is of the so-called "coplanar" type. In a specific embodiment of FIG. 1, this TFT preferably comprises a polycrystalline silicon film 2 on a substrate 1 of, for example, glass or quartz. The same substrate 1 carries many other TFTs which are not shown, for example a matrix of active devices (TFTs or even diodes) and peripheral circuitry which form a liquid-crystal display (LCD) panel or sensor array or memory array. FIG. 1 shows only one island of the film 2, and the one TFT formed in this island may be, for example, a high-mobility device forming part of the circuitry used to address or drive columns or rows of the matrix. After depositing the material for film 2 in known manner, it may be crystallized into large crystal grains by furnace annealing or laser annealing, and is divided into the separate islands for each active device. The conductivity of the large-grain material of the film 2 is effectively intrinsic with its Fermi level near the middle of the energy bandgap. However the film 2 may be lightly doped with a suitable donor such as phosphorus or a suitable acceptor such as boron, so as to adjust the gate threshold voltage of the TFT and/or to give the crystallized film 2 a light n or p type conductivity.

In the manufacture of the device of FIG. 1, one or more semiconductor layers are deposited on the upper face of the film 2 to provide the intermediate layer 55 and electrode layer 56 of the source and drain 5 and 6. As already mentioned, such layers 55 and 56 may be deposited in a single step; in this case the doping concentration may be increased during the deposition, or the desired doping profile may be provided after the deposition by ion-implanting or diffusing the dopant into the deposited material. FIG. 1 illustrates, by way of example, an n channel FET, and in this case phosphorous may be used as the donor dopant to give the different doping concentrations (illustrated as n and n+) in silicon layer parts 55 and 56. However, the layer 55 may be deposited first with one doping concentration (n) after which a second deposition may be carried out to provide the electrode layer 56 with the higher doping concentration (n+). The layer 55 has a higher conductivity-determining doping concentration (and hence more free charge-carriers and a lower resistance) than the film 2.

Figure 3:
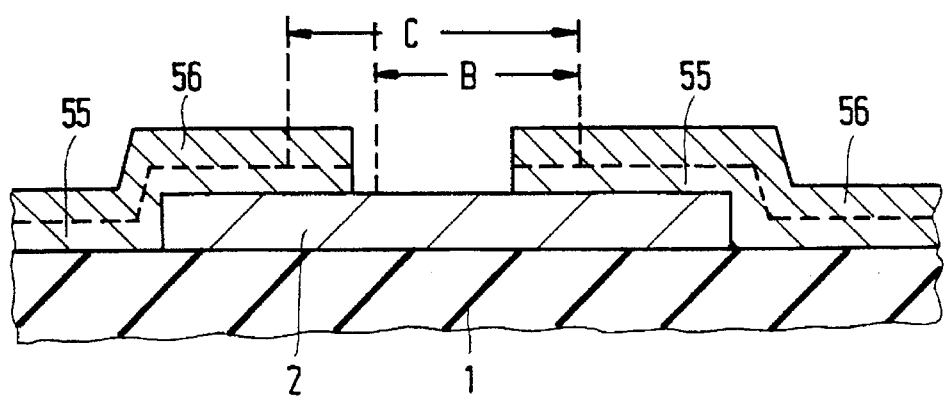
FIG. 3 is a similar cross-sectional view of parts of the TFT of FIG. 1 or FIG. 2 at a stage during its manufacture by a method in accordance with the invention.

Using a photolithographic and etching step, the layers 55 and 56 are then etched away from the film 2 in the area where the transistor channel is to be formed. The resulting structure is illustrated in FIG. 3. Separate source and drain areas of the layers 55,56 remain extending on opposite end portions of the film island 2.

Using another photolithographic and etching step, a photoresist mask is provided on the FIG. 3 structure. This mask has a window extending over the distance B (illustrated in FIG. 3) to define an area over which the drain electrode layer 56 is to be etched away from the underlying intermediate layer 55. Plasma etching or an etchant solution comprising catechol may be used, and the etching is terminated when the desired low doping concentration of layer 55 is reached. In this manner, the electrode layer 56 of the drain 6 is separated laterally from the channel area of the transistor, and a stepped layer structure is formed for the drain 6. In a further photolithographic step the further extent of the source and drain 5 and 6 may then be confined to the film island 2, as illustrated in FIG. 1.

The insulated gate structure of the TFT is then formed by depositing an insulating layer 3 (for example of silicon dioxide) on the island 2, followed by a conductive gate layer (for example of aluminum or chromium or highly doped n+ polycrystalline silicon. A photolithographic and etching step is then carried out in known manner to define the required insulated gate structure 3 and 4 of the TFT, as illustrated in FIG. 1. The remaining layer parts 3 and 4 extend as a stripe (perpendicular to the plane of the drawing) across the film island 2. Both the insulating layer 3 and gate 4 overlap the intermediate layer 55 adjacent to the area A of the drain drift region and also overlap the electrode layer 56 of the source 5 in the FIG. 1 embodiment. An insulating overlay 8 is subsequently deposited, and metal connections 44,45,46 respectively to the gate, source and drain 4,5 and 6 are provided at contact windows in the overlay 8. Gate connection 44 is outside the plane of the drawing and so is not illustrated in FIG. 1.

The non-overlapped and non-modulated area A of the intermediate layer 55 extends along substantially the whole area of the lateral separation, from the transistor channel to the drain electrode layer 56 in FIG. 1. This area A of the intermediate layer 55 has a low conductivity-determining doping which is higher than that of the film 2 and so maintains an acceptably low drain series resistance in the on-state of the TFT. Also, in the on-state (as well as in the off-state), it provides field relief by dropping the applied drain bias along a significant length of the low-doped intermediate layer 55 of the drain 6. This reduces carrier heating in the field and so reduces the effects of hot carriers in degrading the TFT characteristics during and after operation of the TFT with high drain bias voltages (for example at least 15 or 20 or even 30 volts) applied to connection 46. For this purpose in the TFT of FIG. 1, the area A preferably extends a distance of more than 1 µm (micrometer) from the edge of the drain electrode layer 56 to where it is overlapped and modulated by the gate 4.

Some simplified indication of the minimum distance Xmin needed to support the spread of the space-charge region in the area A before it touches the drain electrode layer can be obtained from the simple relationship:

$$X_{min}^2 = \frac{2\epsilon_s.\epsilon_p.V_-}{q} \left( \frac{Nd^2}{Na} + Nd \right)^{-1} \quad (1)$$

where

V=the drain bias voltage (for example 20 or 30 volts),

Nd=the donor dopant density in the low-doped n layer 55,

Na=the effective negative space charge density in the intrinsic film 2 adjacent to the layer 55, $\epsilon_s$=the permittivity of silicon for the film 2 and layer 55, $\epsilon_o$=the permittivity of free space, and q=the electronic charge.

This equation gives a value Xmin of less than 0.5 µm with typical values of V, Nd and Na such as are used for a driver TFT for LCDs. However the equation is derived from a simplified one-dimensional model which does not include the effect of the gate field on the spread of the space-charge region. When the gate-field contribution is included, the minimum required distance Xmin is larger than that given by equation (1), for example about 1 µm. The actual distance chosen for area A in a practical device will normally be more than the minimum, especially when this dimension of area A is determined using a separately aligned photolithographic step. Thus, in practice, the distance chosen is a compromise between the resulting field relief and the amount of series resistance introduced by any undepleted length of the low-doped layer 55. For particular device structures the length, thickness and doping level of the layer 55 in the area A can be optimized so that the field relief occurs with only an acceptable increase in series resistance, and so that the high field region is shifted away from the semiconductor insulator interface where damage induced by the hot carriers seems to occur.

In a specific example of the FIG. 1 embodiment using a separately-aligned photolithographic step to define the area A, this distance along the area A is preferably 2 μm or even 3 μm for a silicon layer 55 having a thickness of 0.1 μm and a donor doping level of $10^{17}$ cm$^{-3}$, an intrinsic silicon film 2 with a thickness of 0.1 μm and a mobility of 20 cm$^{-2}$.V$^{-1}$s$^{-1}$, a channel length of 6 μm, a silicon dioxide gate insulator 3 having a thickness of 0.15 μm, and bias voltages of up to about 30 volts applied to the drain connection 46 and up to about 20 volts applied to the gate connection 44.

The advantages resulting from the invention can be seen by comparing characteristics obtained for the TFT of FIG. 1 with a similar TFT in which the drain electrode layer 56 extends to (and is overlapped by) the gate 4 in the same manner as the electrode layer 56 of the source 5 in FIG. 1. In this latter case which is not in accordance with the invention, the applicants find that when a high drain bias (for example at least 20 volts or 30 volts) is applied to the drain connection 46 with any normal gate voltage condition degradation occurs in the TFT characteristics, particularly the off-state leakage current, the on-state current, and the threshold voltage. This degradation appears to result from various effects of hot-carriers generated in the high intensity electric field between the drain 6 and the channel and gate 4. In this high field in the absence of the field-relief area A, charge carriers in the film 2 can attain kinetic energies in excess of a few eV. The resulting hot carriers can be injected over the interfacial potential barrier between the film 2 and gate oxide 3 and can form interface charge states. The hot-carrier injection may charge the gate oxide 3 and so change the gate threshold voltage of the TFT. The high field in both the on- and off-states appears to produce donor levels near the middle of the energy bandgap and acceptor levels near the conduction band edge. As a result of these donor levels, there is an increase in leakage current between source 5 and drain 6 in the off-state (when a negative or zero gate voltage is applied for the n channel TFT). In the on-state (when a positive gate voltage higher than the threshold voltage is applied for the n channel TFT) these acceptor levels become negatively charged and reduce the on-state current between source 5 and drain 6. These hot-carrier degradation effects seem to be primarily a result of drain bias, whereas the role of the gate bias is to increase the instability by increasing the carrier density or current density in the channel.

However, by providing the field relief region of the drain 6 in area A of the layer 55 in accordance with the present invention, the field intensity in this area of the layer 55 and in the underlying part of the film 2 is significantly reduced so reducing significantly these hot-carrier effects.

Figure 2:
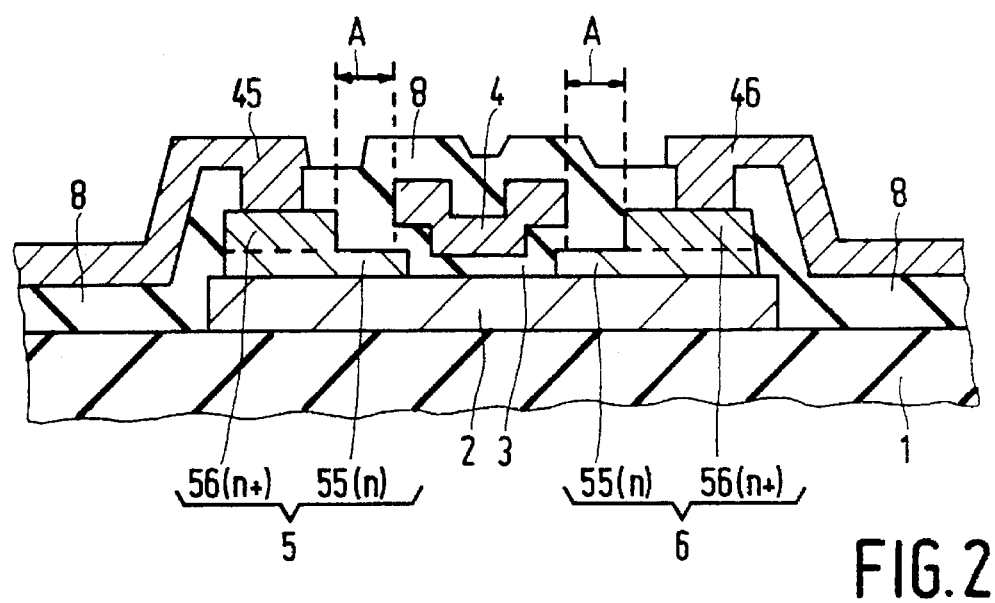
FIG. 2 is a similar cross-sectional view of a slightly modified TFT also in accordance with the invention.

The TFT structure of FIG. 1 is non-symmetrical in that the electrode layer 56 of the source 5 extends up to (and is overlapped by) the insulated gate structure 3,4. This structure can be used in applications where voltages of only one polarity are applied between the source 5 and drain 6 of the TFT. However, in some applications both polarities of voltage may be applied and so it is advantageous to adopt the FIG. 2 structure in this case. FIG. 2 shows a modification in another TFT in accordance with the invention in which the electrode layer 56 has been removed from an area of the intermediate layer 55 both at the drain side and at the source side of the gate 4. This modification can be readily achieved in manufacture at the stage illustrated in FIG. 3 by etching away the layer 56 over the width C rather than merely the width B.

Figure 4:
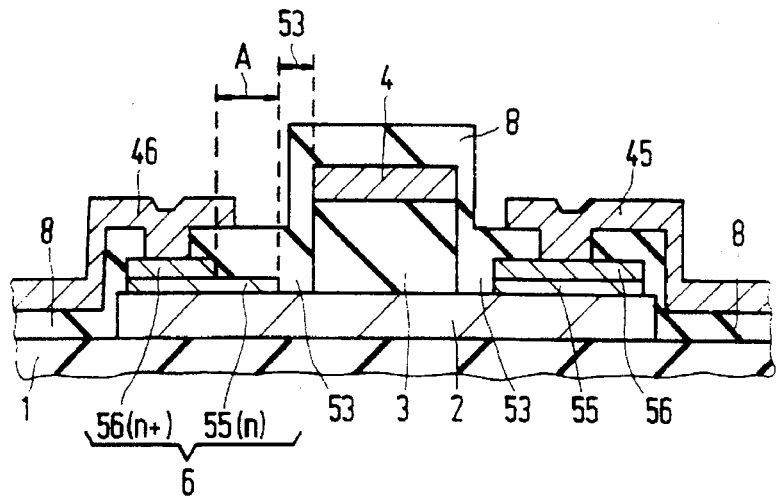
FIG. 4 is a similar cross-sectional view of another TFT in accordance with the invention.

In the devices of FIGS. 1 and 2, the insulated-gate structure 3 and 4 overlaps the source and drain 5 and 6. Parasitic capacitance resulting from this overlap reduces the maximum speed of operation of the TFT. Furthermore, the insulating layer 3 in the area of overlap between the gate 4 and drain intermediate layer 55 is no thicker than it is in the channel area. Thus, the gate voltage modulates the conductance in the layer 55 in this area of overlap and so this overlapped part does not form part of the field-relief region in the area A. FIG. 4 shows a variation for another TFT in accordance with the invention in which there is no such overlap.

In the device structure of FIG. 4, the low-doped intermediate layer 55 may extend laterally up to the gate insulator 3 so that the low-doped drain field-relief region may extend along substantially the whole area of the lateral separation from the drain electrode layer 56 to the transistor channel. However, in the specific example illustrated in FIG. 4, a gap 53 is present between the gate 4 (seen in plan view) and the area A of the intermediate layer 55 providing the low-doped field-relief region of the drain 6. Because of the manner in which the TFT was made a similar gap is shown at the source side between the gate 4 and the source electrode layer 56. At the areas of the gaps, the current path is through the intrinsic film 2 between the low-doped layer 55 and the channel of the TFT. Thus, the gaps add to the series resistance of the source and drain and so are preferably kept small, for example less than 0.5 μm across.

Figure 5:
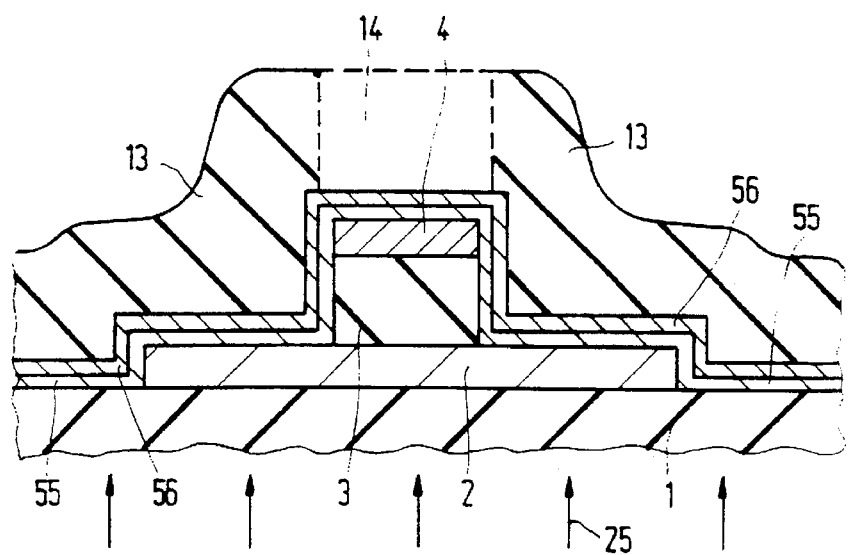
FIGS. 5 and 6 are similar cross-sectional views of parts of the TFT of FIG. 4 at two stages during the manufacture by another method in accordance with the invention.
Figure 6:
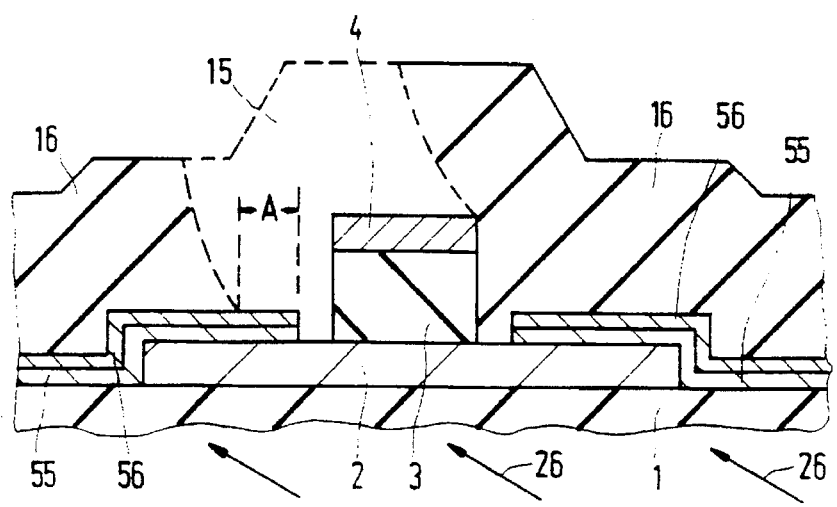

Preferably the gate 4 of the FIG. 4 structure is used as a photomask in defining the facing edges of the source and drain 5 and 6. In this way it is possible to reduce the size of any such gaps 53 and to provide good alignment between the gate 4 and the source and drain 5 and 6. FIGS. 5 and 6 illustrate two photolithographic steps in the manufacture of the FIG. 4 TFT by a method in accordance with the invention. In this method, the insulated gate structure 3 and 4 is formed on the semiconductor film island 2 before depositing the semiconductor electrode and intermediate layers 55 and 56.

The layers 55 and 56 are then deposited and coated with a negative photoresist 13. The photoresist 13 is then exposed to illumination 25 from the back-side of the substrate 1. Thus, the substrate 1, film 2 and layers 55 and 56 are (individually and in combination) transparent to the illumination 25 the wavelength of which may be, for example, in the near ultra-violet or visible region of the spectrum. Although the insulating layer 3 may also be transparent, the metal gate 4 is opaque at this wavelength and so masks the overlying area of the negative photoresist 13. The photoresist is then developed in known manner, and so a window 14 is opened in the unexposed photoresist above the gate 4 and uncovers the layer 56 in this area. The window 14 is illustrated in broken outline in FIG. 5. The layers 56 and 55 are then etched away at the window 14 so as to expose the insulated gate structure 3 and 4 and form separate source and drain areas of the layers 56 and 55. As illustrated in FIGS. 4 and 6, this etch removal of the layers 56 and 55 may be continued until the small gap 53 is formed.

FIG. 6 illustrates a photolithographic step for the removal of the layer 56 from the field-drift area A of the layer 55. A new negative photoresist layer 16 is exposed in this step. An angled illumination 26 is used instead of the perpendicular illumination 25 of FIG. 5, so that the resulting window 15 is shifted laterally towards the drain 6. This window 15 formed by developing this resist 16 is illustrated in broken outline in FIG. 6. The layer 56 uncovered in this window 15 is etched away to define the drain field-relief area A.

It will be evident that many modifications and variations are possible within the scope of the present invention. Thus, for example, instead of the photolithographic step of FIG. 6, a step with a positive photoresist exposed by an angled illumination from the front (upper) face of the FIG. 6 device structure may be used to form a local photoresist region in the area A shadow-masked by the gate 4. This local photoresist region may then be used in a lift-off process to form a complementary mask on the surrounding area for protecting the surrounding area while etching away the layer 56 in the area A at the drain side of the gate 4.

Other types of TFT may be formed with a drain structure in accordance with the present invention. Thus, for example, the TFT may be of the so-called "inverted staggered" type in which the gate 4 and then the insulating layer 3 are formed on the substrate 1, after which the semiconductor film 2 is deposited. Finally the layers 55 and 56 are deposited on the upper face of the film 2 and are then etched to form the separate source 5 and drain 6. Part of the layer 56 is then removed in the area A to form the drain field-relief region in a non-overlapped part of the layer 55 which is not modulated by the buried gate 4.

The manufacture of n channel TFTs has been illustrated with reference to the drawings. However, the invention may also be used in the manufacture of p channel devices having p type source and drain 5 and 6 with the drain field relief region in area A of a low-doped p type layer 55.

From reading the present disclosure, other variations and modifications will be apparent to persons skilled in the art. Such variations and modifications may involve equivalents and other features which are already known in the design, manufacture and use of TFTs and other semiconductor devices and component parts thereof, and which may be used instead of or in addition to features already described herein.

I claim:

1. A method of manufacturing a thin-film transistor comprising a semiconductor film which provides a transistor channel coupled to a gate of the transistor, the transistor having a drain disposed on a face of the semiconductor film, the drain comprising a semiconductor drain electrode layer on a semiconductor intermediate layer on the face of the semiconductor film, the method comprising the steps of:

(a) depositing the semiconductor film of semiconductor material having charge-carrier traps at grain boundaries of the semiconductor material on a substrate;

(b) depositing the semiconductor drain electrode layer on the semiconductor intermediate layer on the face of the semiconductor film, the intermediate layer having a lower conductivity-determining doping concentration than that of the drain electrode layer;

(c) removing a part of the drain electrode layer from the intermediate layer to separate the drain electrode layer laterally from the transistor channel, and to form an area of the intermediate layer which is not overlapped by the drain electrode layer;

(d) depositing an insulating layer on the transistor channel and on the area of the intermediate layer not overlapped by the drain electrode layer, the thickness of the insulating layer deposited on the intermediate layer being the same as the thickness of the insulating layer deposited on the transistor channel; and (e) providing the gate on the insulating layer over the transistor channel so as not to overlap and modulate at least a part of said area of the intermediate layer, which part provides, along the intermediate layer, a low-doped field-relief region in the area of lateral separation and serves to reduce the electric field intensity between the gate and the drain electrode layer.

2. A method as claimed in claim 1, wherein the drain electrode layer and intermediate layer are parts of a single deposited layer having a doping concentration which varies gradually from a higher level in the drain electrode layer part to a lower level in the intermediate layer part.

3. A method as claimed in claim 1, wherein the gate is provided in step (e) so as not to overlap an area of the intermediate layer which extends to a distance of at least one micrometer (1 µm) from the drain electrode layer to provide the low-doped field-relief region.

4. A method as claimed in claim 2, wherein the gate is provided in step (e) so as not to overlap an area of the intermediate layer which extends to a distance of at least one micrometer (1 µm) from the drain electrode layer to provide the low-doped field-relief region.

5. A method as claimed in claim 1, wherein the gate is provided in step (e) so as not to overlap an area of the intermediate layer which extends from the drain electrode layer towards the gate over a distance greater than the distance X given by the following relationship:

$$X_2 = \frac{30 \epsilon s . \epsilon o}{q} \left( \frac{Nd^2}{Na} + Nd \right)^{-1}$$

where:

Nd=dopant density in the intermediate layer;

Na=effective space charge density in the semiconductor film (2) adjacent to the intermediate layer;

εs=permittivity of the semiconductor film and intermediate layer;

εo=permittivity of free space; and q=electronic charge.

6. A method as claimed in claim 2, wherein the gate is provided in step (e) so as not to overlap an area of the intermediate layer which extends from the drain electrode layer towards the gate over a distance greater than the distance X given by the following relationship:

$$X_2 = \frac{30 \epsilon s . \epsilon o}{q} \left( \frac{Nd^2}{Na} + Nd \right)^{-1}$$

where:

Nd=dopant density in the intermediate layer;

Na=effective space charge density in the semiconductor film (2) adjacent to the intermediate layer;

εs=permittivity of the semiconductor film and intermediate layer;

εo=permittivity of free space; and q=electronic charge.

* * * * *